United States Patent [19]

Clements

[11] Patent Number: 4,954,875
[45] Date of Patent: Sep. 4, 1990

[54] SEMICONDUCTOR WAFER ARRAY WITH ELECTRICALLY CONDUCTIVE COMPLIANT MATERIAL

[75] Inventor: Ken Clements, Santa Cruz, Calif.

[73] Assignee: Laser Dynamics, Inc., Scotts Valley, Calif.

[21] Appl. No.: 414,633

[22] Filed: Oct. 28, 1987

Related U.S. Application Data

[63] Continuation-in-part of Ser. No. 6/887,129, Jul. 17, 1986, Pat. No. 4,897,708.

[51] Int. Cl.$^5$ ............................................. H01L 23/16
[52] U.S. Cl. ........................................ 357/75; 357/81; 357/68; 357/55; 357/76
[58] Field of Search ........................ 357/75, 81, 68, 55, 357/76

[56] References Cited

U.S. PATENT DOCUMENTS

| | | | |
|---|---|---|---|
| 2,627,545 | 2/1953 | Muss et al. | 175/366 |
| 2,734,154 | 2/1956 | Pankove | 317/235 |
| 3,197,766 | 7/1965 | Stein et al. | 340/378 |
| 3,475,660 | 10/1969 | Coblenz | 317/234 |
| 3,561,110 | 2/1971 | Feulner et al. | 29/602 |
| 3,648,131 | 3/1972 | Stuby | 317/235 R |
| 3,769,702 | 11/1973 | Scarbrough | 29/627 |
| 3,813,773 | 6/1974 | Parks | 29/630 R |
| 3,858,958 | 1/1975 | Davies | 339/17 LM |
| 3,867,759 | 2/1975 | Siefker | 29/628 |
| 3,904,934 | 9/1975 | Martin | 317/101 D |
| 3,967,162 | 6/1976 | Ceresa et al. | 317/101 CM |
| 3,999,105 | 12/1976 | Archey et al. | 317/100 |
| 4,029,375 | 6/1977 | Gabrielian | 339/17 M |
| 4,037,246 | 7/1977 | Pellant et al. | 357/82 |
| 4,050,756 | 9/1977 | Moore | 339/59 M |
| 4,129,881 | 12/1978 | Reichel et al. | 357/82 |
| 4,295,700 | 10/1981 | Sado | 339/61 M |
| 4,368,106 | 1/1983 | Anthony | 204/15 |
| 4,394,712 | 7/1983 | Anthony | 361/411 |
| 4,437,109 | 3/1984 | Anthony et al. | 357/68 |
| 4,499,655 | 2/1985 | Anthony | 29/576 J |
| 4,509,099 | 4/1985 | Takamatsu et al. | 361/413 |
| 4,558,396 | 12/1985 | Kawabata et al. | 361/399 |
| 4,574,331 | 3/1986 | Smolley | 361/393 |
| 4,581,679 | 4/1986 | Smolley | 361/395 |
| 4,596,069 | 6/1986 | Bayaktaroglu | 357/76 X |

FOREIGN PATENT DOCUMENTS 59-127856 7/1984 Japan ............................... 357/75 X

OTHER PUBLICATIONS

Fang, "Interplanar LSI Structure," *IBM Technical Disclosure Bulletin*, vol. 20, No. 4, Sep. 1977, pp. 1604–1605.
Kendall–Vertical Etching of Silicon at Very High Aspect Ratios, Am. Rev. Mater. Sci., 1979, pp. 373–403.
Bassous–Fabrication of Novel Three–Dimensional Micro–Structures by the Anisotropic Etching of (100) and (110) Silicon, IEEE Transactions on Electron Devices, vol. ED-25, No. 10, Oct., 1978.
Dawson–Button–Board: The Short–Cut Connector; Connection Technology, Nov. 1986, pp. 15–16.
Bernhard–Focus on Conductive Elastomers, Electronic Design, Nov. 20, 1986, pp. 149–154.
Naegele–A Better Way to Connect Optical Fiber and Chips, Jan. 6, 1986. p. 21.

*Primary Examiner*—William Mintel
*Attorney, Agent, or Firm*—Fliesler, Dubb, Meyer & Lovejoy

[57] ABSTRACT

A semiconductor wafer array comprising a plurality of wafers of semiconductor material. Each of the wafers is provided with cone-shaped or pyramid-shaped vias. Inserted in each of the vias is a correspondingly shaped wad of electrically conductive compliant material for forming continuous vertical electrical connections between the wafers in the stack. The base of each wad makes connection to a bonding pad on the surface of a lower wafer as well as to the electrically conductive compliant material in the lower wafer.

21 Claims, 5 Drawing Sheets $S2 = S1 + \sqrt{2}\, t - 2\sqrt{2}\, rt$

SEMICONDUCTOR WAFER ARRAY WITH ELECTRICALLY CONDUCTIVE COMPLIANT MATERIAL

CROSS REFERENCE TO RELATED APPLICATION

The present application is a continuation-in-part of application Ser. No. 06/887,129, filed July 17, 1986, now U.S. Pat. No. 4,897,708, issued Jan. 30, 1990, entitled "Semiconductor Wafer Array" and assigned to the assignee of the present application.

BACKGROUND OF THE INVENTION

1. Field of the Invention

The present invention relates to semiconductor wafer arrays in general and in particular to a method and apparatus comprising a stacked array of semiconductor wafers which are vertically interconnected by means of a plurality of wads of an electrically conductive compliant material.

2. Description of the Prior Art

Since the development of integrated circuit technology, computers and computer storage devices have been made from wafers of semiconductor material comprising a plurality of integrated transistor circuits. After the wafer is made, the circuits are separated from each other by cutting the wafer into small chips. Thereafter, the chips are bonded to carriers of varying types, interconnected by tiny wires and packaged.

The above-described process of making computers and computer memory devices has been found to be time-consuming and costly and the use of tiny wires to electrically connect the chips has often been found to be unreliable. Moreover, the length of the wires which has been required to make the necessary interconnections between chips has been found to result in undesirable signal delays as the frequency of operation of the devices has increased.

To avoid some of the disadvantages of the prior technology, a number of efforts have been made to eliminate the need for separating chips in a wafer and interconnecting them using wires. For example, a technology called Wafer Scale Integration (WSI) attempted to do this. In WSI, techniques were used to wire together all the chips on a single wafer; however, the attempts thus far have not been successful. It was found that the line widths required to provide a computer on a single wafer, even when multiple layers of lateral connections were used, became so small that it was not possible to obtain lines of sufficient length and precision to make the necessary interconnections between the circuits therein.

The use of WSI technology which uses lateral connections to connect the circuits on a single wafer also has disadvantages when used for making storage devices. In practice, all wafers comprise randomly located defects. The defects render the circuits affected unusable. Since WSI technology incorporates the defective circuits at the time a wafer is made, it is difficult and costly to build in an amount of redundancy sufficient to overcome the effect of the defects. In any event, even if a single wafer comprising a large number of storage cells could be built at a reasonable cost, the memory capacity required in many applications far exceeds that which can be provided on a single wafer. Therefore, such applications would still require that a plurality of such wafers be used and that the wafers be interconnected in some suitable manner.

Other attempts to avoid the disadvantages of interconnecting a plurality of stacked wafers using wires have involved large scale parallel array processors and memory devices in which parallel circuit members are interconnected using vertical columns of solid, dense conductive material such as solder, copper, etc. For example, in U.S. Pat. No. 4,368,106, there is disclosed a process for making a solid, dense metallic feedthrough in a semiconductive material comprising the use of an electroforming solution and apparatus. In U.S. Pat. No. 4,394,712, there is disclosed a process for making a feedthrough in a semiconductor wafer array comprising three solid concentric materials including a central core of solder. In making the array, a plurality of the wafers are stacked and solder, which has been implanted in vias in the wafers and slightly beyond, is caused to flow, interconnecting the wafers.

The use of solid, dense feedthroughs to interconnect a plurality of wafers is typically costly and time consuming and makes it difficult to separate the wafers in the event that a wafer is or becomes defective and requires repair or replacement. The reason for this is that the heat required to form and/or sever the interconnections can be damaging to the wafers and the circuits located therein. Also, differential thermal coefficients of expansion between the rigid feedthroughs and the surrounding semiconductor and other materials can result in damaging stresses during thermal cycling.

In applicant's above-described co-pending patent application there is disclosed a semiconductor wafer array. In the array each wafer is provided with one or more vias, as by chemical or laser drilling or the like. After the walls of the vias and the wafers are coated with a layer of electrically insulating material, the wafers are stacked one on top of another with the vias in one wafer placed in registration with corresponding vias in adjacent wafers and clamped or bonded together as by an adhesive. After the wafers are bonded to a larger diameter interconnection wafer, all of the vias in the array are filled with an electrically conductive liquid. After the vias are filled, the exposed ends of the vias are sealed with compliant material. The array is then packaged with electrical connections made thereto by means of wires connecting pads on the interconnection wafer and externally projecting pin members.

While avoiding the disadvantages associated with rigid vertical electrical feedthroughs, the use of electrically conductive liquid to form the interconnections does require special tooling to fill the vias.

In applications requiring fewer vertical feedthroughs which thus lessen the need for very small vias and the use of an electrically conductive liquid to form the vertical electrical connections, it is found that vias which are somewhat larger may be filled with an electrically conductive compliant material. Such material may, for example, comprise wads of very fine wire or wads of electrically conductive elastomeric material.

The idea of using compliant wadded fine wire, sometimes called "fuzz wire", to make an electrical connection between two electrical conductors is old, dating back to the use of "fuzz wire" to make RF seals in microwave cabinets and waveguides. The idea of using compliant "fuzz wire" for providing vertical connections between individual boards in a stack of printed circuit boards is also known and was proposed in U.S. Pat. Nos. 4,574,331 and 4,581,679 by Robert Smolley.

In his patents Smolley discloses a stack of printed circuit boards. On each of the boards there is provided an electrical contact area or pad. The pad may be formed on the surface of the boards or on a metallic feedthrough inserted in a via in the boards. Interposed between each of the boards there is an insulated board referred to as a button board. The button board has a plurality of circular openings formed through it, and in each opening is placed a connector element, also known as a "fuzz button" or button connector. The button connector is formed from a single strand of metal wire, each strand being wadded together to form a nearly cylindrical "button" of material. When the button elements are placed in the holes, the button material projects slightly out of the holes on both ends. When a compressive force is applied to the stack of printed circuit boards, the insulated board interposed therebetween and the button elements, the latter are compressed against the contact areas or pads forming an electrical connection therebetween.

For several reasons, the use of "fuzz wire" in the manner disclosed by Smolley to form vertical electrical connections between a stack of printed circuit boards has certain disadvantages. For example, to provide vertical electrical connections between a stack of printed circuit boards, metallic feedthroughs are required to be inserted in vias provided in the boards and an insulated board is required to insulate the printed circuit boards from each other and to hold the button elements in place. Because of the cylindrical shape of the button elements, both the metallic feed throughs and the insulated boards are required to make an electrical connection to circuits on the boards and to insure the application of uniform compressive forces to the button elements. These features, the insulated boards and the metalic feedthroughs, require a considerable amount of space and increase the complexity of the manufacturing and assembly process.

In U.S. Pat. No. 4,029,375 issued to Henry Gabrielian, there is disclosed in two embodiments of an electrical connector the use of a cylindrically shaped metalic helical spring member for vertically electrically interconnecting electrical pads located on two spaced-apart printed circuit boards. As in the case of the Smolley invention, however, Gabrielian also requires an intermediate insulating board to both insulate the printed circuit boards from each other and to hold the spring members in position in order to make the necessary electrical connections. The use of an intermediate insulating board to insulate the printed circuit boards from each other and to hold the electrically connecting spring members adds expense to the apparatus, increases the overall size of the apparatus, as well as adding steps to the fabrication of an array using them.

SUMMARY OF THE INVENTION

In view of the foregoing, principal objects of the present invention are a method and apparatus comprising a semiconductor wafer array in which the individual wafers in the array, as distinguished from printed circuit boards, are stacked one on top of another and vertically electrically interconnected using an electrically conductive compliant material such as a wad of fine wire or a wad of electrically conductive elastomer.

In accordance with the above objects, each wafer in the array is provided with one or more vias, as by chemical or laser drilling or the like. After the walls of the vias in the wafers are coated with a layer of electrically insulating material, the vias are filled with wads of electrically conductive compliant material and the wafers are stacked one on top of another.

The shape of the vias and the wads are important features of the present invention. In order to eliminate the necessity for a separate means for holding the individual wads of electrically conductive compliant material in position and to provide vertical electrical connections between wafers as well as lateral electrical connections to electrical circuits on each of the wafers, the vias and wads are formed with inwardly sloping walls having an overall cone, hourglass or pyramid shape. A ring-shaped electrical pad which is electrically laterally connected to circuits on a wafer is provided surrounding the apex or small end of the vias as needed. The apex or small end of the wads is formed to project beyond the apex of the vias and the "base or large end" of the wads is formed to project beyond the base of the vias. When a stack of such wafers is formed the apex of a wad is compressed into the base of a wad in a wafer adjacent thereto. At the same time the base of the latter wad is compressed against the electrically conductive ring-shaped pad thus forming both a vertical electrical connection to an overlying wafer as well as to the electrical circuits connected to the pad.

In the process of fabricating an array, the wafers are oriented with the apex of cone-shaped or similarly shaped vias facing downwardly. Cone-shaped or similarly shaped wads of electrically conductive compliant material are then placed in the vias. Because of their respective shapes, the wads are prevented from falling out of the vias so long as the wafers are not turned over. After all of the vias in the wafers are loaded with the wads, the wafers are stacked together and placed on a base plate.

The base plate is fitted with a plurality of electrical feedthrough pins which make contact with the base of the wads of electrically conductive compliant material in the lowest one of the wafers in the array. The wafer at the top of the stack is provided with a pressure applying member so as to press all of the wafers together, thereby compressing the individual wads of electrically conductive compliant material together as described above. As will be appreciated wafers may be added to or removed from the stack as required and the over-all change in the size of the stack merely corresponds to the thickness of the wafer involved.

BRIEF DESCRIPTION OF THE DRAWING

The above and other objects, features and advantages of the present invention will become apparent from the following detailed description of the accompanying drawing, in which.

DETAILED DESCRIPTION OF THE DRAWINGS

Figure 1:
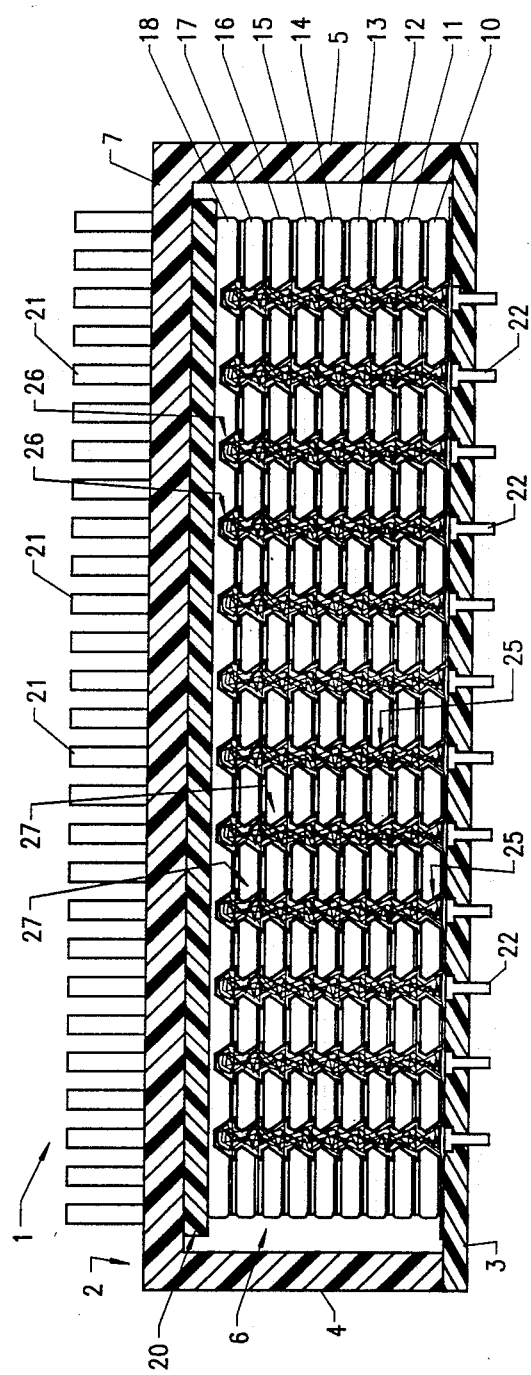
FIG. 1 is a cross-sectional view of a semiconductor wafer array comprising a plurality of stacked wafers according to the present invention.

Referring to FIG. 1, there is provided in accordance with the present invention a semiconductor wafer array designated generally as 1. In the array 1 there is provided a housing 2 mounted on a base plate 3. In the housing 2 there is provided a plurality of side walls 4, 5 and 6 and a top wall 7. A front wall corresponding to side walls 4–6 is not shown. Located in the housing 2 between the base plate 3 and top wall 7, there is provided a stack of semiconductor wafers 10–18. In the stack of wafers 10–18, the bottom wafer 10 is located adjacent to the base plate 3. The top wafers 18 is located nearest to the top wall 7. Wafer 18 may be a dummy wafer which is used simply for terminating the vertical electrical connecting members and forming an electrical connection with the pads on wafer 17 as will be further described below. On top of wafer 18 between wafer 18 and top wall 17, there is provided a compliant electrically insulating thermally conductive pad 20. Pad 20 is located between the wafer 18 and the top wall 7 to compensate for thermal expansion and contraction of the stack of wafers 10–18 and for conducting heat from the stack of wafers 10–18 to the top wall 7. Extending from the top wall 7 there is provided a plurality of metallic fingers 21. Fingers 21 comprise cooling fins for dissipating heat from the housing 2.

Extending through the base plate 3 there is provided a plurality of electrical pin members 22. Pin members 22 are provided for making electrical contact with electrically conductive compliant material in vias in the stack of wafers 10–18, as will be further described below.

In practice, the base plate 3 comprises insulating material, such as ceramic material, for insulating the pin members 22 from each other, and the side wall members 2 and 4 may comprise a metallic material. The free area within the housing 2 may be filled with a conventional electrically non-conductive gaseous or liquid material to facilitate the dissipation of heat from the housing 2.

In each of the wafers 10–17 there is provided a plurality of hourglass-shaped vias 25. Corresponding pyramid-shaped recesses 26 are normally provided in dummy wafer 18. In each of the vias 25 and recesses 26 there is provided a wad 27 of an electrically conductive compliant material, such as, for example, a fine wire or an electrically conductive elastomer. The vias 25 and recesses 26 in the wafers 10–18 are placed in registration with a corresponding via in an adjacent wafer, such that the wads 27 of electrically conductive compliant material in the vias combine to form a conductive vertical column providing electrical connections from feed-through pins 22 to each of said semiconductor wafers 10–18.

While the embodiment of FIG. 1 shows a sealed housing 2, it is understood that conventional ports for circulating cooling gases or fluids may be added to the housing 2 in a manner as best fits the heat flow requirements of the application circuits located therein. Also, in certain applications, certain of the vias 25 may provide vertical connections between two or more but less than all of the wafers.

Referring to FIGS. 2–11, the steps used for fabricating each of the semiconductive wafers in the stack of wafers 10–18 will now be described. For convenience, the description will be made with respect to wafer 10, it being understood that the other wafers 11–17, except for possible differences in the electrical circuits provided therein, are substantially identical insofar as the present invention is concerned.

Figure 2:
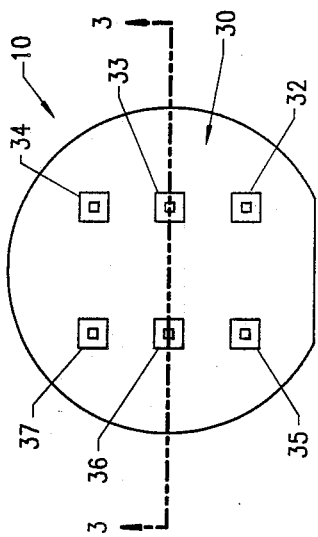
FIG. 2 is a plan view of one of the wafers of FIG. 1 showing several ring-shaped electrical pads on one surface thereof.
Figure 3:
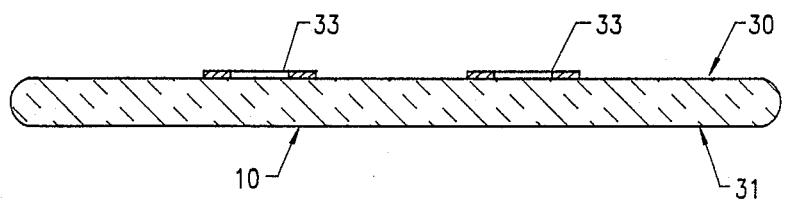
FIG. 3 is a cross-sectional view taken in the direction of lines 3—3 of FIG. 2.

Referring to FIGS. 2 and 3, wafer 10, a 1,0,0 silicon wafer, is provided with a first or topside surface 30 and a second or backside surface 31. Electrical circuits, e.g. logic circuits, memory cells, or the like (not shown), are provided in the surface 30 and laterally electrically connected to one or more ring-shaped pads 32–37. While only 6 pads are shown, it is to be understood that many such pads are normally present on each wafer.

Figure 4:
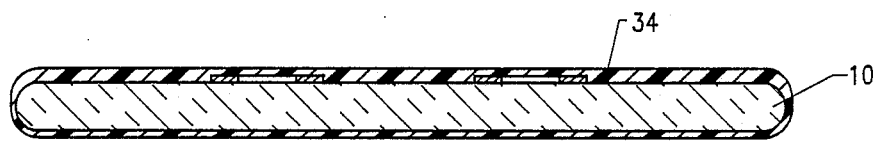
FIG. 4 is a cross-sectional view showing the wafer of FIG. 3 after it has been coated with an etch-resistant material.
Figure 5:
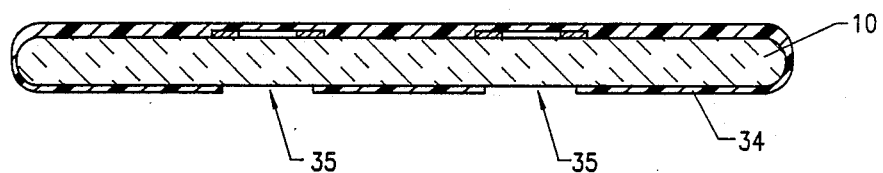
FIG. 5 is a cross-sectional view of the wafer of FIG. 4 after it has been patterned to expose a square area on the backside of the semiconductor wafer substrate beneath the pads.
Figure 6:
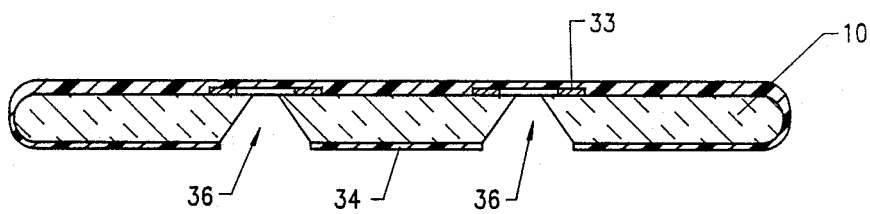
FIG. 6 is a cross-sectional view of the wafer of FIG. 5 showing two through-holes provided therein.

The surfaces 30 and 31 of the wafer 10 are then provided with a coating 34 of etch-resistant material such as silicon nitride as shown in FIG. 4. After the wafer 10 has been coated with the etch-resistant material, the coating 34 is patterned on the backside 31 of the wafer 10 by techniques known in the microlithographic art and plasma-etched so as to provide square openings 35 in the nitride coating exposing the wafer 10 beneath the pads 32–37 as shown in FIG. 5. After the square openings 35 are produced, the wafer 10 is subjected to a conventional anisotropic etch process, such as 85° C. KOH at 35% concentration, that produces a truncated pyramid-shaped hole or recess 36 in the wafer 10 as shown in FIG. 6. Other techniques may also be used for fabricating the holes 36 such as those comprising laser means and combined laser and etch means. Any means that yields roughly pyramid-, cone- or hourglass-shaped vias, while avoiding damage to the surface of the wafer, may be used for the purpose of this invention.

Figure 7:
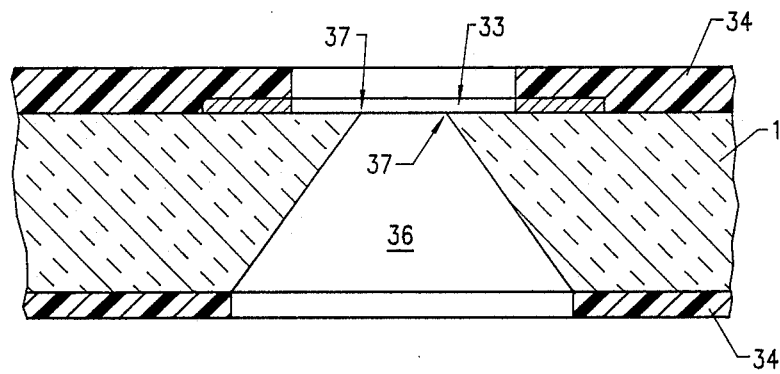
FIG. 7 is an enlarged cross-sectional view of one of the vias shown in FIG. 6 after the etch-resistant coating shown in FIGS. 4–6 is removed from the center of the ring-shaped pad surrounding the via.
Figure 8:
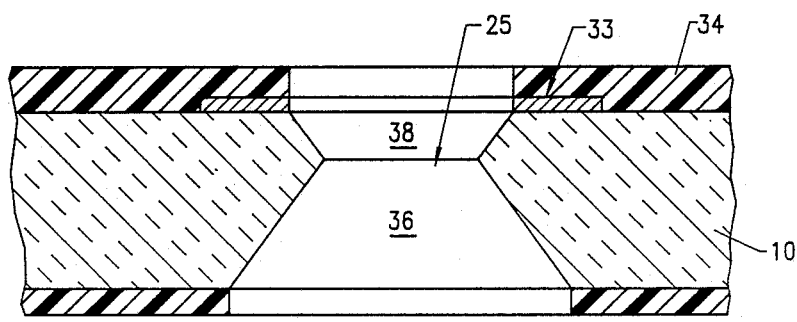
FIG. 8 is a cross-sectional view of the via of FIG. 7 after the sharp edges at the apex of the via are removed.

Referring to FIG. 7, there is shown an enlarged cross-sectional view of the pad 33 and hole 36 in the wafer 10. As shown in FIG. 7, the anisotropic etch process used for making the holes 36 as described above with respect to FIG. 6 produces extremely sharp and therefore somewhat fragile edges 37 which are subject to chipping and cracking. In order to remove the sharp edges 37, the silicon nitride coating 34 in the center of the pad 33 is removed and the wafer 10 subjected to a second short anisotropic etching process. This etching process produces a second inverted truncated pyramid-shaped hole 38, thus forming square-sided hourglass-shaped vias 25 as shown in FIGS. 1 and 8.

Figure 9:
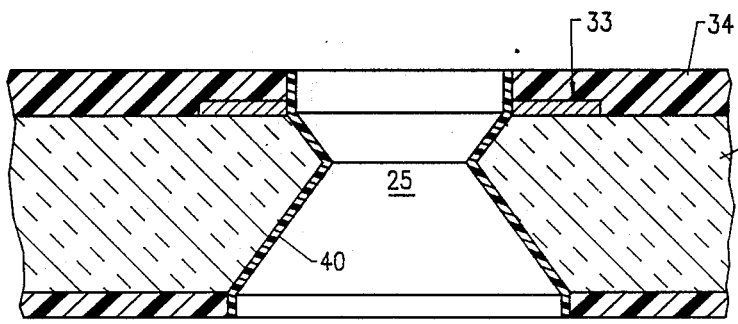
FIG. 9 is a cross-sectional view of the via of FIG. 8 after its walls have been coated with an electrically insulating layer.
Figure 10:
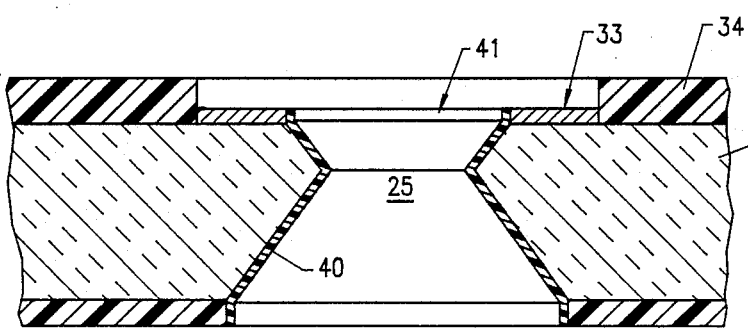
FIG. 10 is a cross-sectional view of the via of FIG. 9 after the etch-resistant coating shown in FIGS. 4–9 is removed from the ring-shaped pad.

After the vias 25 are formed in the wafer 10, an insulating layer 40 of silicon nitride is grown or deposited on the walls of the vias 25 so as to provide electrical isolation of the wafer 10 as shown in FIG. 9. Thereafter, the silicon nitride coating 34 is removed from the bonding pad 33 as shown in FIG. 10. For the purpose of this disclosure, it may be assumed that the wafers 10-18 are approximately 0.020 inches (20 mils) thick, that the aperture 41 at the top of the via 25 is approximately 10 mils on a side and that the aperture 42 at the bottom of the via 25 is approximately 30 mils on a side.

Figure 11:
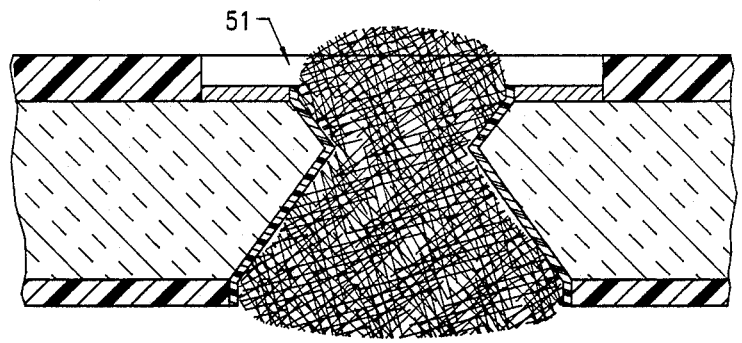
FIG. 11 is a cross-sectional view of the via of FIG. 10 after a wad of compliant electrically conductive fine wire is inserted therein.

Referring to FIG. 11, there is provided in each of the vias 25 a wad of electrically conductive compliant material 45. In one of the embodiments of the present invention, the wad 45 comprises a wad of single strand fine wire. The shape of the wad 45 is roughly that of a pyramid or a cone. The diameter of the wire used to make the wad 45 is approximately 1/10th that of the width of the top side aperture 41, i.e. 1 mil, and the volume of the wire used is such as to fill the vias 25 to within 10 to 20% of their volume; the remainder of the via volume comprising the air space between the wire in the wad. Any suitable conventional means may be used for pre-forming the wads 45 into the desired shape.

Figure 12:
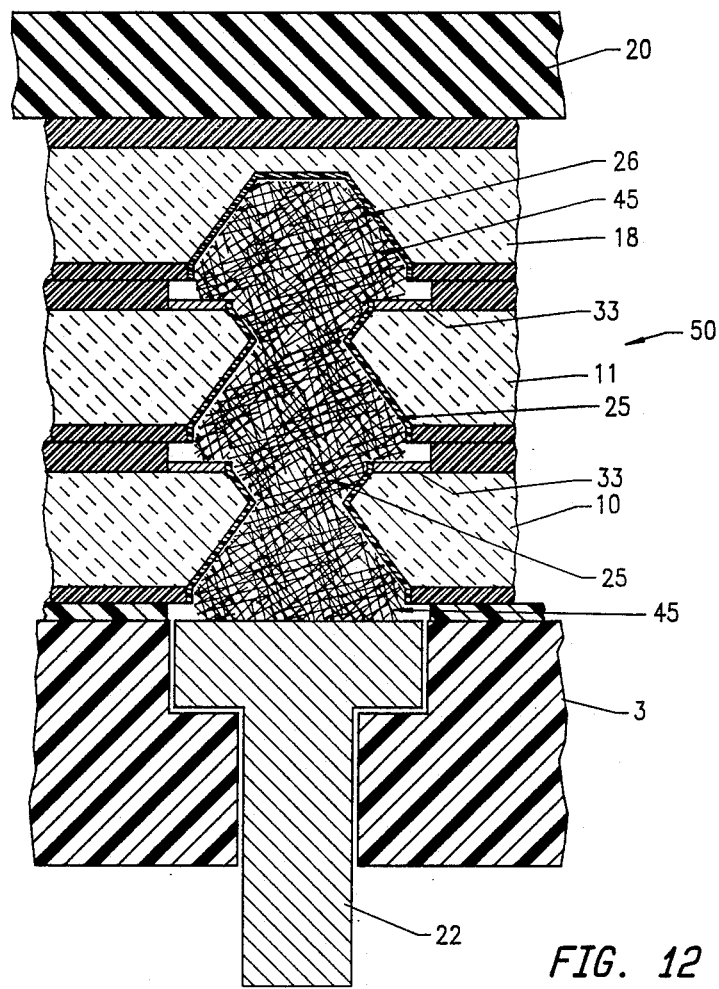
FIG. 12 is an enlarged partial cross-sectional view showing two wafers stacked one on top of another between a dummy wafer and a base plate with the wad of FIG. 11 inserted in each of the vias located therein according to the present invention.

Referring to FIG. 12, there is shown an assembly 50 comprising three of the wafers 10-18, namely wafers 10, 11 and 18, having vias 25 and 26, each containing a wad of compliant fine wire as described above with respect to FIG. 11. The wafers 10, 11 and 18 are supported on the base 3 with the vias 25 and 26 in each of the wafers located in registration with one of the feedthrough pins 22 in the base 3. Located on top of the stack of wafers 10, 11 and 18 there is also provided the thermally conductive pad 20 described above with respect to FIG. 1. The wafers 10, 11 and 18 may also contain through-holes for the purpose of receiving alignment pins (not shown) for holding the vias in the wafers in alignment. Of course, other means may also be used for keeping the wafers in alignment.

The configuration of the vias 25 and 26 and the wads 45 as shown in FIGS. 11 and 12 is an important feature of the present invention. The pyramid or cone shape of each of the wads 45 allows its base or larger end to make connection to the wafer bonding pad 33 while its apex or smaller end makes connection to the base of the next higher vertical wad 45. In the case of the bottom wafer 10, the base of the wad 45 therein makes an electrical contact with the feedthrough pin 22, as also shown in FIG. 1. In the case of the top dummy wafer 18, the dummy wafer 18, without circuits, is used as a containment for the top level of wads 45 so as to compress the wads and provide an electrical connection to the pad 33 on the topmost circuit wafer 11 and the underlying wad 45 in the wafer 11.

Figure 13:
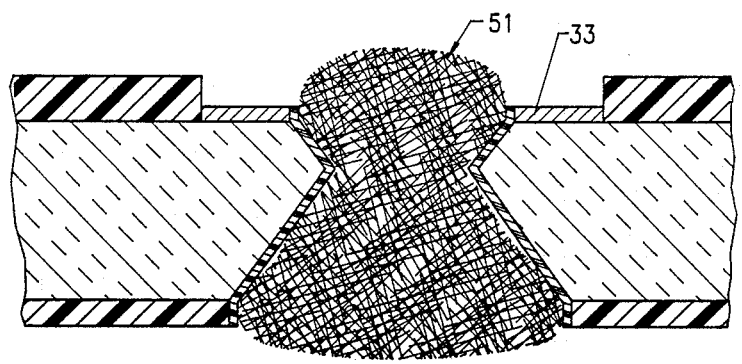
FIG. 13 is an enlarged partial cross-sectional view showing an alternative embodiment of the present invention, comprising electrically conductive compliant elastomeric material.

As an alternative to the fine wire wads 45 of FIG. 12, FIG. 13 shows a shaped form of conventional compliant conductive elastomer 51. A plurality of wads 51 may be used in place of wads 45 if desired.

Figure 14:
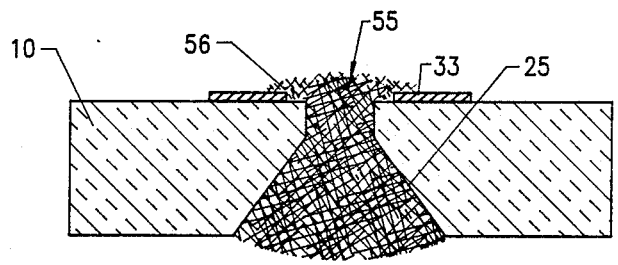
FIG. 14 is an alternative embodiment of the present invention showing the top of a wad of fine wire compressed onto the pad surrounding the via.

Referring to FIG. 14, there is provided in an alternative embodiment of the present invention a wad of electrically conductive compliant wire material 55. Wad 55 is substantially identical to wad 45 described above with respect to FIGS. 11 and 12 with the exception that the wad 55 is made to extend through the wafer 10 and a portion 56 thereof is then compressed back against the bonding ring pad 33 so as to cause the wafer to retain the mass of fine wire 55 in the vias 25 and to insure contact to the bonding ring 33. This configuration may be used in place of the wads 45 used in wafer 10-17 and, if used in wafer 17 at the top of the stack, the use of the dummy wafer 18 to insure the making of an electrical contact to the pad 33 on the wafer 17 may be avoided.

Figure 15:
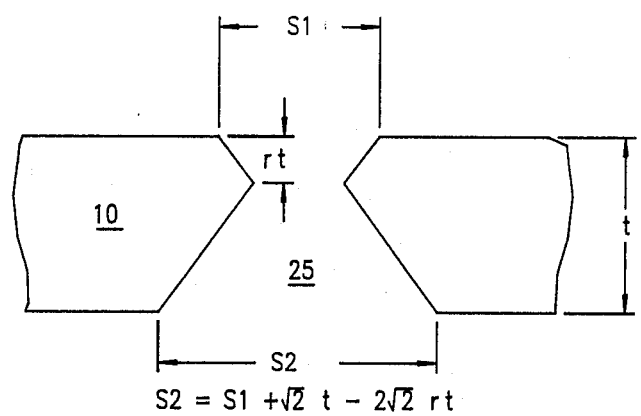
FIG. 15 is a partial cross-sectional view showing relative dimensions of the vias in the wafers.

Referring to FIG. 15, the width s2 of the vias 25 is given by the equation $$s2 = s1 + \sqrt{2}\, t - 2\sqrt{2}\, rt$$

where
  s1 is the width of the apex of the vias 25,
  t is the thickness of the wafer 10 and
  r is a constant having a value less than unity, (e.g. 0.1-0.2.)

While several embodiments of the present invention are described above, it is contemplated that various modifications may be made thereto without departing from the spirit and scope of the present invention. For example, the second etch described above for making the hole 38 may be an isotropic etch thereby producing the same sized hole but with parallel sidewalls. Of course, the pads 45 may be similarly shaped. In all cases, the methods and means used for forming the vias and the wads comprise conventional semiconductor wafer processing techniques. Accordingly, it is intended that the embodiments described be considered only as illustrative of the present invention and that the scope thereof should not be limited thereto but be determined by reference to the claims hereinafter provided and their equivalents.

What is claimed is:

1. A semiconductor wafer array comprising:
  a plurality of wafers of semiconductors material which are stacked one on top of another, each of said plurality of wafers having
    (a) a via which is in registration with a via in an adjacent wafer, said via in each of said plurality of wafers having a first end terminated by a first hole in a first surface of each of said wafers, a second end terminated by a second and relatively larger hole in a second and opposite surface of each of said wafers, and an inwardly directed wall surface in at least a portion of the wall between said first and said second ends;
    (b) means for electrically insulating an exposed surface of said via in each of said plurality of wafers between said first and said second ends;
    (c) an electrically conductive pad surrounding said first hole of said via in each of said plurality of wafers for making an electrical connection to electrical circuits located on said first surface of each of said plurality of wafers; and
    (d) an electrically conductive compliant material which is located in said via in each of said plurality of wafers which, when not compressed, extends outwardly beyond respective planes of said first and said second holes of said via in each of said plurality of wafers; and
  means for stacking a first one of said plurality of wafers on top of a second one of said plurality of wafers such that the compliant material which extends beyond said second hole of said via in said first one of said plurality of wafers will make an electrical contact with said electrically conductive pad surrounding said first hole of said via in said second one of said plurality of wafers and said compliant material which extends from said first hole of said via in said second one of said plurality of wafers.

2. An array according to claim 1 wherein said inwardly directed wall surface of said vias in each of said wafers restricts movement of said compliant material in said vias through said first hole when pressure is applied to said compliant material in the direction of said first hole.

3. An array according to claim 1 wherein said electrically conductive compliant material comprises a cone-shaped portion.

4. An array according to claim 3 wherein said electrically conductive compliant material comprises an elongated portion having substantially parallel side portions which extend from the apex of said cone-shaped portion.

5. An array according to claim 1 wherein said via comprises side walls having the shape of a truncated pyramid.

6. An array according to claim 5 wherein said via comprises an elongated portion having substantially parallel side walls which extend from the truncated end of said pyramid-shaped side walls.

7. An array according to claim 3 wherein said compliant material comprises a wad of wire.

8. An array according to claim 3 wherein said compliant material comprises a compliant electrically conductive elastomer.

9. An array according to claim 1 wherein said first surface of each wafer comprises a compliant electrically insulating material.

10. A semiconductor wafer array comprising:
a housing having a base plate and a top wall;
a plurality of wafers of semiconductive material which are stacked one on top of another between said base plate and said top wall, one of said wafers being located adjacent to said base plate, another of said wafers being located nearest to said top wall, each of said wafers having at least one via which is in registration with a via in another of said wafers, said via in each wafer having a first end terminated by a first hole in a first surface of said wafer, a second end terminated by a second hole in a second and opposite surface of said water, said second hole having a larger diameter than said first hole and an inwardly directed wall surface in at least a portion of the wall between said first and said second ends of said via;
means for electrically insulating the exposed surface of said via between said first and second ends thereof;
an electrically conductive pad surrounding said first hole in each wafer for making an electrical connection to electrical circuits located on said first surface of said wafer;
an electrically conductive compliant material which is located in said via in a wafer and, when not compressed, extends outwardly beyond the plane of said first and said second holes of said via in each wafer so as to make an electrical contact with the electrically conductive pad surrounding said hole and the compliant material in the via of an underlying wafer;
an electrically conductive feedthrough pin mounted in said base plate for making an electrical contact with said electrically compliant material in said via in said wafer located adjacent to said base plate; and
means located between said top wall and said wafer located adjacent to said top wall for applying pressure to said stack of wafers such that said compliant material in a wafer is compressed against the compliant material in a wafer adjacent thereto for forming an electrically conductive path between said adjacent wafers.

11. An array according to claim 10 wherein said pressure applying means comprises means for conducting heat from said stack of wafers to said top wall.

12. An array according to claim 11 wherein said heat conducting means for conducting heat from said stack of wafers to said top wall comprises a compliant member for compensating for thermal expansion and contraction of said stack of wafers.

13. An array according to claim 12 comprising means mounted in said top wall and extending outwardly therefrom for dissipating heat from said top wall.

14. An array according to claim 10 wherein each of said vias comprises side walls having the shape of a truncated pyramid.

15. An array according to claim 14 wherein each of said vias comprises an elongated portion having substantially parallel side walls which extend from a truncated end of said pyramid-shaped side walls.

16. An array according to claim 10 wherein said compliant material comprises a wad of wire having a bottom portion comprising an inclined surface extending inwardly from the bottom thereof toward the top thereof and an upper portion with generally parallel side wall portions.

17. An array according to claim 10 wherein said compliant material comprises a wad of electrically conductive elastomer material having a bottom portion comprising an inclined surface extending inwardly from the bottom thereof toward the top thereof and an upper portion with parallel side wall portions.

18. An array according to claim 16 wherein said bottom portion is cone-shaped.

19. An array according to claim 16 wherein said bottom portion is pyramid-shaped.

20. An array according to claim 17 wherein said bottom portion is cone-shaped.

21. An array according to claim 17 wherein said bottom portion is pyramid-shaped.

* * * * *

UNITED STATES PATENT AND TRADEMARK OFFICE
CERTIFICATE OF CORRECTION

PATENT NO. : 4,954,875
DATED : September 4, 1990
INVENTOR(S) : KEN CLEMENTS

It is certified that error appears in the above-identified patent and that said Letters Patent is hereby corrected as shown below:

Title page, line [21], "414,633" should be --114,633--.
Column 9, line 48, "water" should be --wafer--.

Signed and Sealed this

Fourth Day of February, 1992

Attest:

HARRY F. MANBECK, JR.

*Attesting Officer*      *Commissioner of Patents and Trademarks*